(12) United States Patent
Hung

(10) Patent No.: US 9,668,390 B2
(45) Date of Patent: May 30, 2017

(54) ELECTROMAGNETIC INTERFERENCE SUPPRESSING STRUCTURE AND ELECTRONIC DEVICE HAVING THE SAME

(71) Applicant: SK hynix Inc., Gyeonggi-do (KR)

(72) Inventor: Kuo Ying Hung, Hsinchu County (TW)

(73) Assignee: SK Hynix Inc., Gyeonggi-do (KR)

( * ) Notice: Subject to any disclaimer, the term of this patent is extended or adjusted under 35 U.S.C. 154(b) by 12 days.

(21) Appl. No.: 14/878,688

(22) Filed: Oct. 8, 2015

(65) Prior Publication Data

US 2016/0197389 A1  Jul. 7, 2016

(30) Foreign Application Priority Data

Jan. 6, 2015  (TW) .............................. 104100291 A

(51) Int. Cl.
*H04B 3/28* (2006.01)
*H05K 9/00* (2006.01)
*H01P 1/203* (2006.01)
*H01P 3/02* (2006.01)
*H05K 1/02* (2006.01)

(52) U.S. Cl.
CPC ......... *H05K 9/0081* (2013.01); *H01P 1/2039* (2013.01); *H01P 3/026* (2013.01); *H05K 1/0227* (2013.01); *H05K 1/0245* (2013.01)

(58) Field of Classification Search
CPC .. H05K 9/0081; H05K 1/0227; H05K 1/0245; H01P 3/026; H01P 1/2039

USPC ........................................................... 333/12
See application file for complete search history.

(56) References Cited

U.S. PATENT DOCUMENTS

| | | | | |
|---|---|---|---|---|
| 7,932,793 B2* | 4/2011 | Wu | ..................... | H01P 1/20336 333/185 |
| 8,509,311 B2* | 8/2013 | Sato | ..................... | H04N 19/176 375/240.08 |
| 8,907,748 B2* | 12/2014 | Pajovic | ................. | H01P 1/2005 333/202 |

FOREIGN PATENT DOCUMENTS

TW          201334651          8/2013

* cited by examiner

*Primary Examiner* — Robert Pascal
*Assistant Examiner* — Kimberly Glenn
(74) *Attorney, Agent, or Firm* — IP & T Group LLP

(57) ABSTRACT

An electromagnetic interference suppressing structure including a multi-layered substrate; a differential pair including first and second signal lines which are disposed on a first layer of the multi-layered substrate; and two grounding recess structures disposed symmetrically in a second layer of the multi-layered substrate which is positioned under the first layer, and on both sides, respectively, of the differential pair, wherein no electrical coupling element extends across a region lying directly under the differential pair, between the two grounding recess structures.

8 Claims, 7 Drawing Sheets

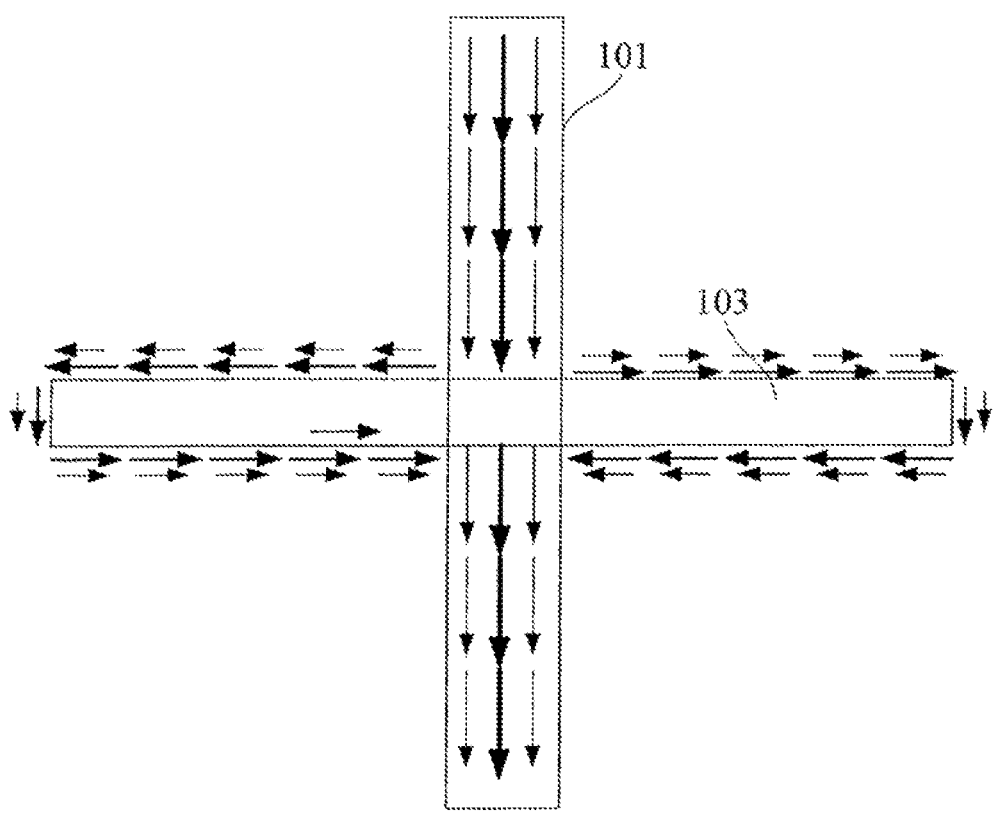

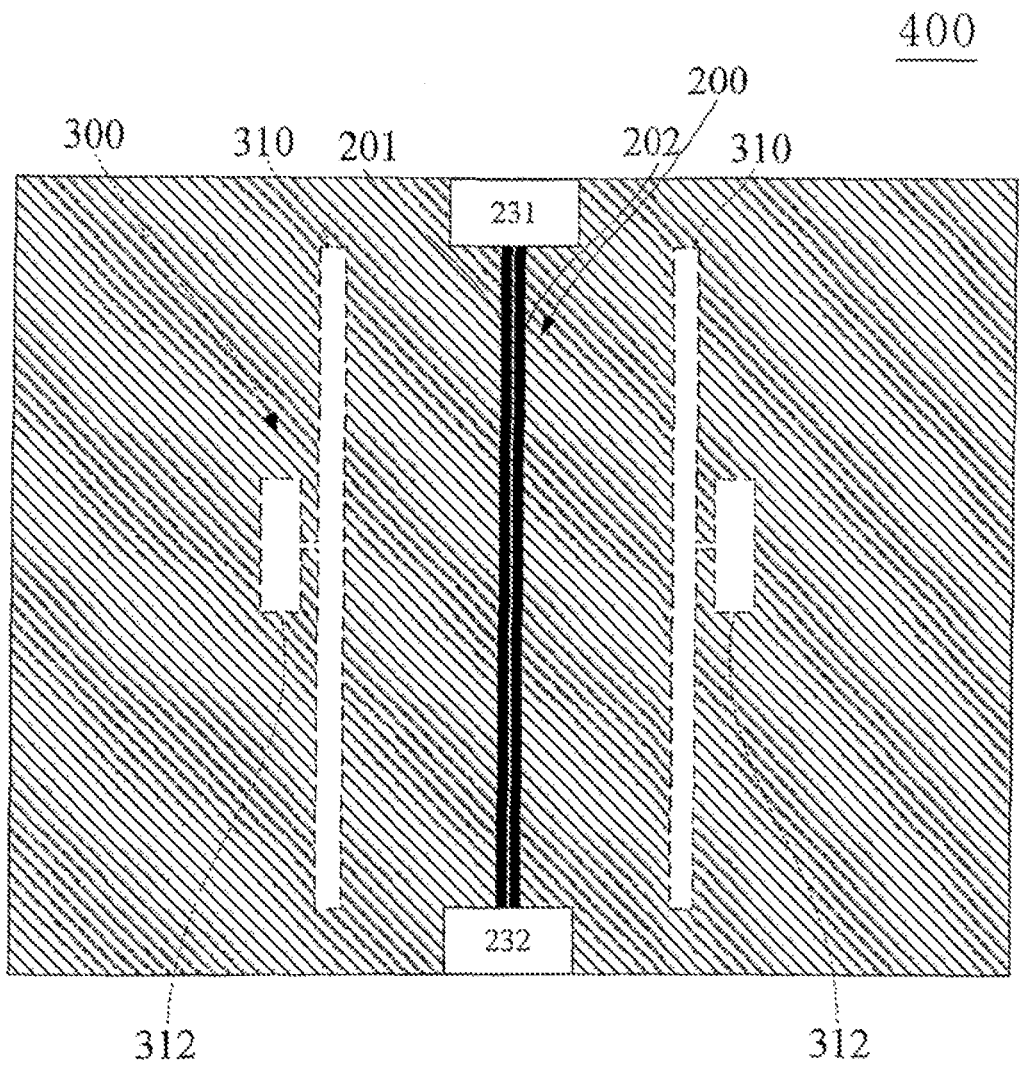

ELECTROMAGNETIC INTERFERENCE SUPPRESSING STRUCTURE AND ELECTRONIC DEVICE HAVING THE SAME

CROSS-REFERENCES TO RELATED APPLICATION

The present application claims priority under 35 U.S.C. §119(a) to Taiwan application number 104100291, filed on Jan. 6, 2015, which is incorporated herein by reference in its entirety.

BACKGROUND

1. Technical Field

Various embodiments generally relate to a structure for reducing electromagnetic interference and an electronic device using the same, and more particularly, to an electromagnetic interference suppressing structure to which coplanar waveguides (CPQ) are applied and an electronic device having the same.

2. Related Art

With distribution and development of electronic devices such as computers, computer hosts, portable electronic appliances and mobile communication terminals which operate electronic systems, electronic operations of those devices are unavoidably influenced by an increased amount of electromagnetic interference (EMI) induced internally or from an external sources. Interference sources may be generated from external electronic devices or internal electrical circuits. Suppression targets of EMI are mainly divided into radiated electromagnetic interference and conducted electromagnetic interference. Since radiated EMI is transferred directly through an open space without needing a transmission medium, it may be generally suppressed by shielding, grounding, etc. Since conducted EMI transfers noise by a power source or a signal circuit, other circuits inside an electronic device and the circuits externally connected with the electronic device generate conducted EMI and may interfere with a signal circuit of the electronic device. Therefore, electromagnetic interference is an unavoidable problem in any electronic and electrical circuit regardless of its high speed digital design. In particular, a differential signal transmitted as high speed data has serious common mode noise which is generated during signal transmission. The electromagnetic interference generated from common mode noise exerts a substantial influence on a wireless communication system interfacing with a device or an appliance.

FIG. 1A is a diagram illustrating the electromagnetic interference exerted on an electronic device by an externally connected device and a wireless communication device. FIG. 1A depicts a notebook computer 111 as an example. The notebook computer 111 is influenced by not only the electromagnetic interference transferred through a port such as, a USB port from an externally connected device 113 but is also influenced by wireless electromagnetic interference from a mobile communication device 115 positioned close to the notebook computer 111. FIG. 1B is a diagram illustrating the electromagnetic interference exerted on an internal circuit of an electronic device by common mode noise, The drawing slows interference phenomena induced by crosstalk 121, bend 122, length mismatch 123 and layout requirement 124. All of these interference types exert an influence on a wireless transmission system, and accordingly, difficulties exist in transmitting and receiving wireless signals in a wireless communication module. Hence, it is necessary to suppress such interference.

In conventional art, a common mode choke element is disposed in an electrical circuit to suppress common mode noise. In this way, common mode noise is suppressed by reaching high induced resistance using a magnetic core of high magnetic permeability. However, the magnetic core of high magnetic permeability may not effectively retain high magnetic permeability during a high frequency period, therefore, a damping phenomenon occurs. This prevents a common mode choke element from effectively suppressing common mode noise during high speed data transmission.

According to conventional art, a filtering structure for suppressing common mode noise is formed in a region positioned under differential signal lines. In addition to forming filters such as a transverse filtering portion and an interframe filtering portion in a substrate on both sides of and under the differential signal lines, the filtering structure also includes a common mode filter which is formed in the substrate directly under the differential signal lines and connects the transverse filtering portion and the interframe filtering portion. FIG. 1C is a diagram illustrating a filtering structure when a differential signal transfers current, according to conventional art. Referring to FIG. 1C, since a common mode filter 103 directly below a differential signal line 101 separately increases a new interference source, discontinuity of a differential signal may result and the quality of a digital transmission signal may be degraded.

SUMMARY

Various embodiments are directed to reducing generation of common mode noise in the course of transmitting a signal.

Also, various embodiments are directed to reducing electromagnetic interference through disposing coplanar waveguide (CPW) structures and at the same time, not forming a separate interference source.

In an embodiment, an electromagnetic interference suppressing structure may include: a multi-layered substrate; a differential pair including first and second signal lines which are disposed on a first layer of the multi-layered substrate; and two grounding recess structures disposed symmetrically in a second layer of the multi-layered substrate which is positioned under the first layer and on both sides, respectively, of the differential pair, wherein no electrical coupling element extends across a region lying directly under the differential pair and between the two grounding recess structures.

Each of the two grounding recess structures may include a strip region and an extended region which is connected to the strip region. The two grounding recess structures may be symmetrically positioned in the second layer of the multi-layered substrate with the differential pair positioned at a middle, and two extended regions of the two grounding recess structures may be connected to and respectively positioned outside two strip regions of the two grounding recess structures, wherein the second layer of the multi-layered substrate may serve as a grounded conductive layer, and portions recessed in the grounded conductive layer may form the two grounding recess structures.

The extended region may have a rectangular shape, a polygonal shape, or a substantial S-shape.

A length of a perimeter of the extended region may correspond to a common mode signal having a certain frequency range, which passes through the differential pair and in which electromagnetic interference is suppressed.

In an embodiment, an electronic device including an electromagnetic interference suppressing structure may include a multi-layered substrate; two chips disposed on a first layer of the multi-layered substrate; a differential pair including first and second signal lines which are disposed on the first layer of the multi-layered substrate and connect the two chips and are used as signal transmission channels between the two chips; and two grounding recess structures disposed symmetrically in a second layer of the multi-layered substrate which is positioned under the first layer and on both sides, respectively, of the differential pair, wherein no electrical coupling element extends across a region lying directly under the differential pair, between the two grounding recess structures.

According to the embodiments, by forming coplanar waveguide structures with respect to the signal transmission lines of a differential pair, by two grounding recess structures symmetrically disposed in the second layer of a multi-layered substrate on both sides of the differential pair, the common mode interference of the differential pair may be effectively suppressed. Due to this configuration, since the two grounding recess structures according to the embodiments do not extend across a region lying under the differential pair, electromagnetic interference is not exerted on the differential pair. As a consequence, it is possible to provide an improved electromagnetic interference suppressing effect.

BRIEF DESCRIPTION OF THE DRAWINGS

FIG. 1C is a diagram illustrating a filtering structure when a differential signal transfers current, according to conventional art

FIG. 5 is a plan view illustrating an example of an electronic device which uses an electromagnetic interference suppressing structure, in accordance with another embodiment.

DETAILED DESCRIPTION

Hereinafter, an electromagnetic interference suppressing structure and an electronic device having the same will be described below with reference to the accompanying drawings which illustrate various examples of embodiments.

Figure 1A:
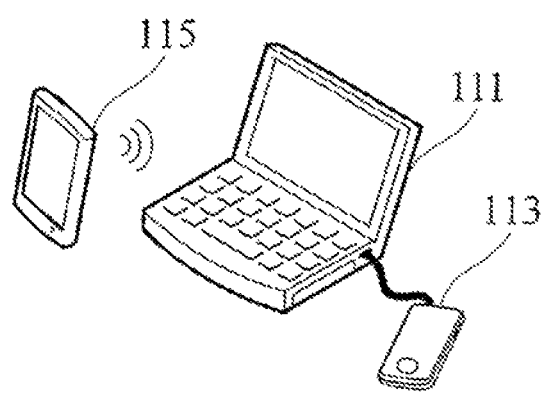
FIG. 1A is a diagram illustrating the electromagnetic interference exerted on an electronic device by common mode noise from externally connected devices.
Figure 1B:
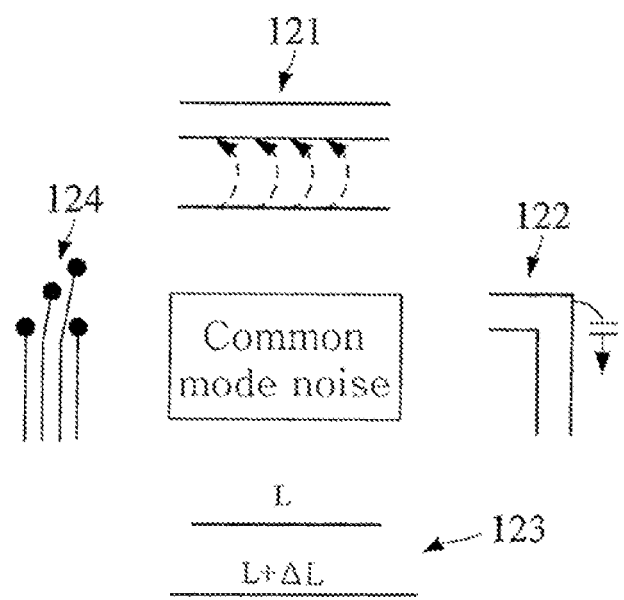
FIG. 1B is a diagram illustrating the electromagnetic interference exerted on an internal circuit of an electronic device by common mode noise.
Figure 2A:
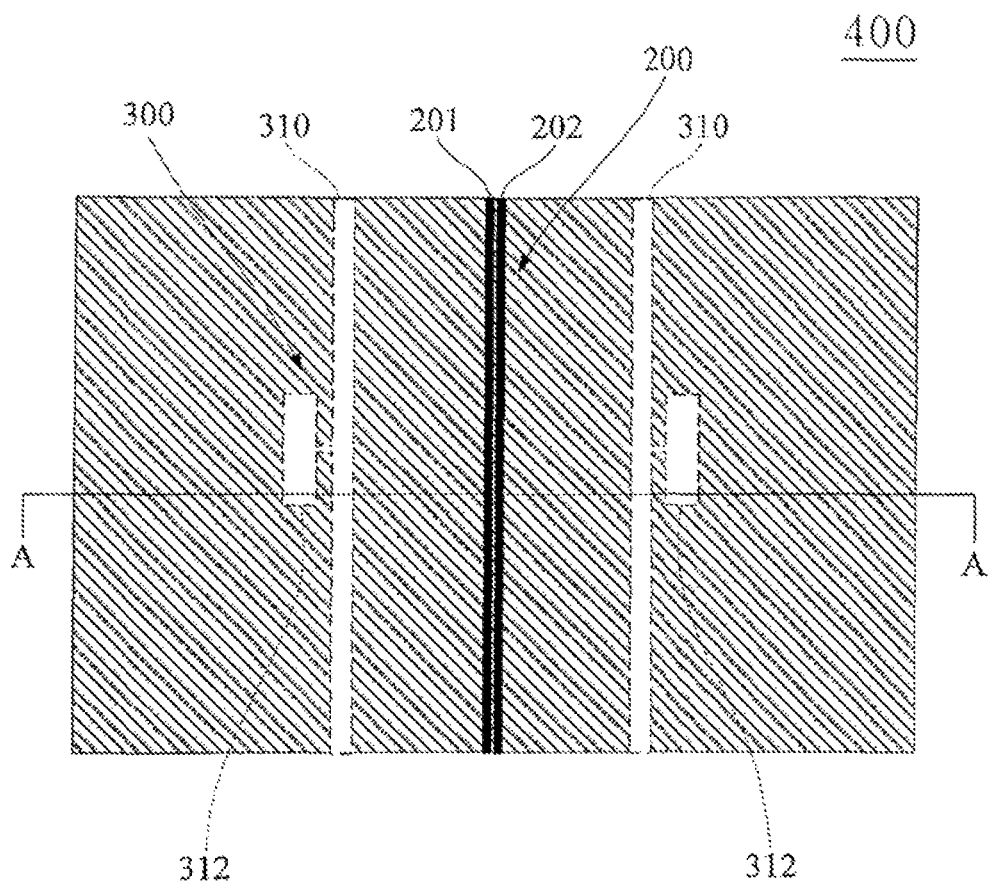
FIG. 2A is a plan view illustrating an example of an electromagnetic interference suppressing structure in accordance with an embodiment.
Figure 2B:
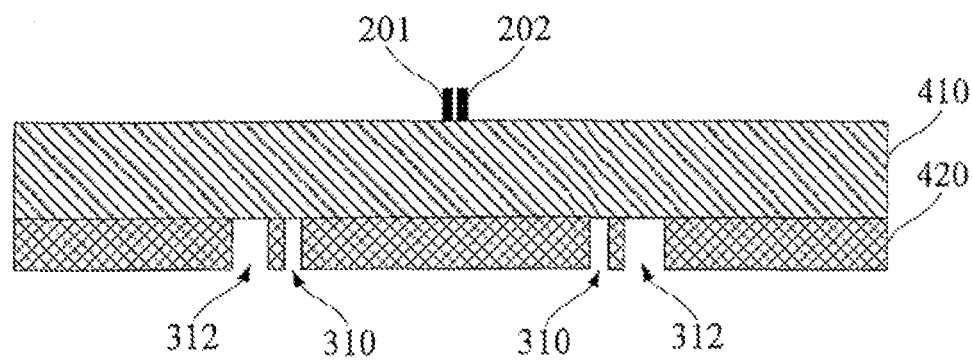
FIG. 2B is a cross-sectional view taken along the line A-A of FIG. 2A.

FIG. 2A is a plan view illustrating an example of an electromagnetic interference suppressing structure in accordance with an embodiment, and FIG. 2B is a cross-sectional view taken along the line A-A of FIG. 2A. The electromagnetic interference suppressing structure in accordance with the embodiment includes a multi-layered substrate 400, a differential pair 200, and two grounding recess structures 300.

The multi-layered substrate 400 may include all substrates capable of being used as a signal line carrier. The differential pair 200 includes a first signal line 201 and a second signal line 202 which are disposed on a first layer 410 of the multi-layered substrate 400. The two grounding recess structures 300 are disposed symmetrically in a second layer 420 of the multi-layered substrate 400 on both sides, respectively, of the differential pair 200 including the first and second signal lines 201 and 202. The second layer 420 of the multi-layered substrate 400 is positioned under the first layer 410. No electrical coupling element extends across a region lying directly under the differential pair 200, between the two grounding recess structures 300. That is to say, unlike the conventional art, no grounding structure passes across the region lying directly under the differential pair 200.

While the embodiment illustrates an example in which the two layers 410 and 420 are stacked, those of ordinary skill in the art will readily understand that the embodiment is not limited to the illustration of FIGS. 2A and 2B and at least one stack structure may be additionally disposed over the first layer 410 or under the second layer 420.

Accordingly, in the embodiment, by symmetrically disposing the two grounding recess structures 300 with respect to the differential pair 200 and positioning the two grounding recess structures 300 in the second layer 420 of the multi-layered substrate 400, on both sides, respectively, of the differential pair 200, the two grounding recess structures 300 may form coplanar waveguide structures with respect to the signal lines 201 and 202 of the differential pair 200, whereby it is possible to effectively suppress the, common mode interference of the differential pair 200.

The signal lines 201 and 202 and the two grounding recess structures 300 may be formed of a conductive material. For example, the signal lines 201 and 202 and/or the two grounding recess structures 300 may include a metal such as titanium nitride, tantalum nitride, nickel silicide, cobalt silicide, silver, aluminum, copper, tungsten, titanium, tantalum, tantalum carbide (TaC), tantalum silicon nitride (TaSiN), tantalum carbon nitride (TaCN), titanium aluminum (TiAl) and titanium aluminum nitride (TiAlN), a metal alloy, other appropriate materials, or a combination thereof. The signal transmission lines 201 and 202 may include a material the same as or different from the two grounding recess structures 300.

The two grounding recess structures 300 may be described in detail as follows. Each of the two grounding recess structures 300 includes a strip region 310 and an extended region 312. The extended region 312 is connected with the strip region 310. The two grounding recess structures 300 are symmetrically positioned in the second layer 420 of the multi-layered substrate 400, with the differential pair 200 positioned at the middle between them. The two extended regions 312 of the two grounding recess structures 300 are respectively connected to and positioned outside the two strip regions 310 of the two grounding recess structures 300. The second layer 420 of the multi-layered substrate 400 serves as a grounded conductive layer, and the portions recessed in the grounded conductive layer form the two grounding recess structures 300.

In various embodiments, different electromagnetic interference (EMI) suppressing effects may be achieved by controlling a geometrical shape. The geometrical shape is determined by a common mode signal having a certain frequency range which passes through the differential pair 200 in which electromagnetic interference is to be suppressed, and is selected to correspond with the length of the perimeter of the extended region 312. Since the length of the perimeter of the extended region 312 may be determined by the size of the shape of the extended region 312, improved noise suppression ability may be achieved.

Figure 3:
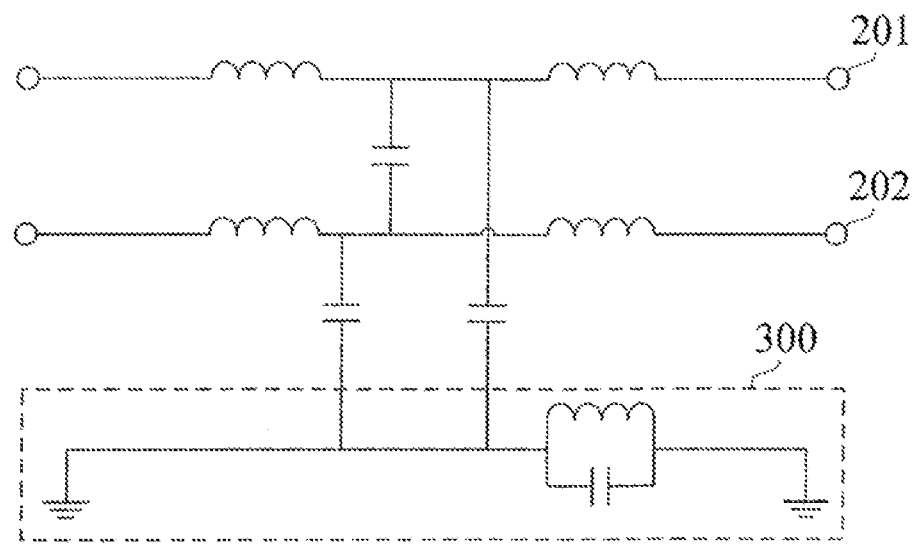
FIG. 3 is an equivalent electrical circuit diagram illustrating a electromagnetic interference suppressing structure in accordance with an embodiment.

FIG. 3 is an equivalent electrical circuit diagram of the electromagnetic interference suppressing structure in accordance with the embodiment, Inductance and capacitance are generated between the first signal line 201 and the second signal line 202 of the differential pair 200, due to the effects of mutual inductance and mutual capacitance. FIG. 3 shows only the equivalent electrical circuit of one grounding recess structure 300, that is, the grounding recess structure 300 for one of the first signal line 201 and the second signal line 202. The length of the perimeter of the extended region 312 may exert an influence on the inductance value and the capacitance value of the grounding recess structure 300 shown in FIG. 3. Thus, an electromagnetic interference suppressing effect may be set according to the grounding recess structure 300.

Figure 4:
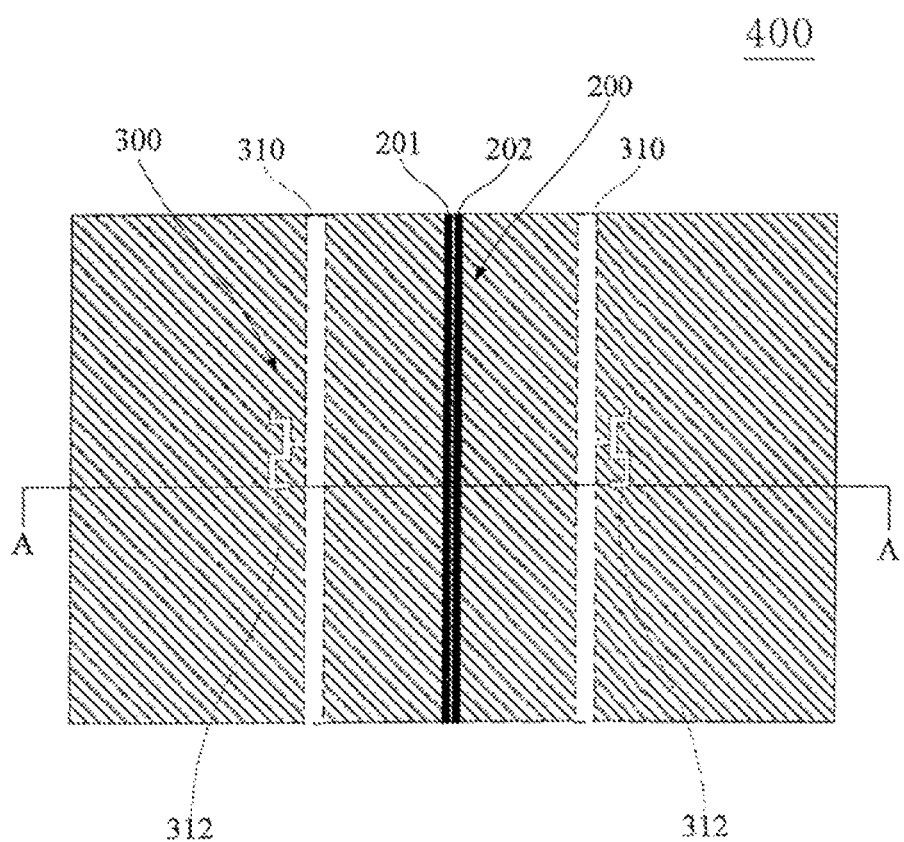
FIG. 4 is a plan view illustrating an example of an electromagnetic interference suppressing structure in accordance with another embodiment.

FIG. 4 is a plan view illustrating an example of an electromagnetic interference suppressing structure in accordance with another embodiment. While FIG. 2(A) illustrates an example in which the extended region 312 has a rectangular shape, the extended region 312 may be designed to have a substantial S-shape which is adapted for a scale-down of an electrical circuit board, such that a maximum length of the perimeter of the extended region 312 may be obtained within a limited area and an optimized EMI suppressing effect may be achieved. In addition to the rectangular shape and the substantial S-shape, various other shapes such as a polygonal shape, a circular shape and an irregular strip shape that is, a shape which is further bent based on the substantial S-shape and thus has an increased perimeter length may be applied according to embodiments.

FIG. 5 is a plan view illustrating an example of an electronic device which uses an electromagnetic interference suppressing structure, in accordance with another embodiment. The embodiment shows, as an example, an electronic device which includes two chips 231 and 232 in addition to the embodiment shown in FIG. 2A. Therefore, the electronic device having an electromagnetic interference suppressing structure in accordance with the embodiment includes a multi-layered substrate 400, the two chips 231 and 232, a differential pair 200, and two grounding recess structures 300. The two chips 231 and 232 are disposed on the first layer of the multi-layered substrate 400, and a first signal line 201 and a second signal line 202 of the differential pair 200 connect the two chips 231 and 232 to each other and are used as signal transmission channels between the two chips 231 and 232.

Figure 6A:
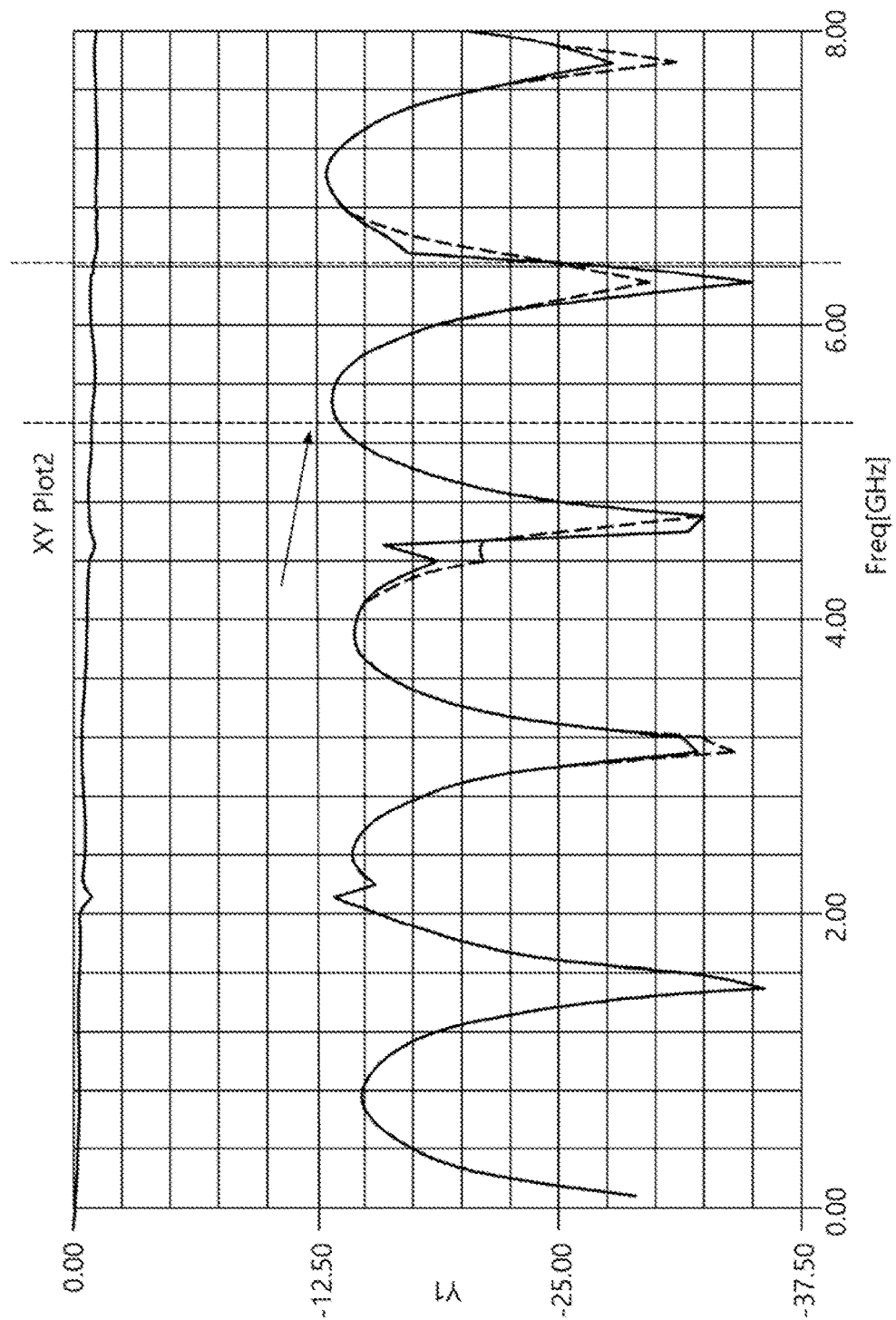
FIG. 6A is a diagram illustrating that noise generation of a differential signal is suppressed when the electromagnetic interference suppressing structure is disposed in accordance with an embodiment.
Figure 6B:
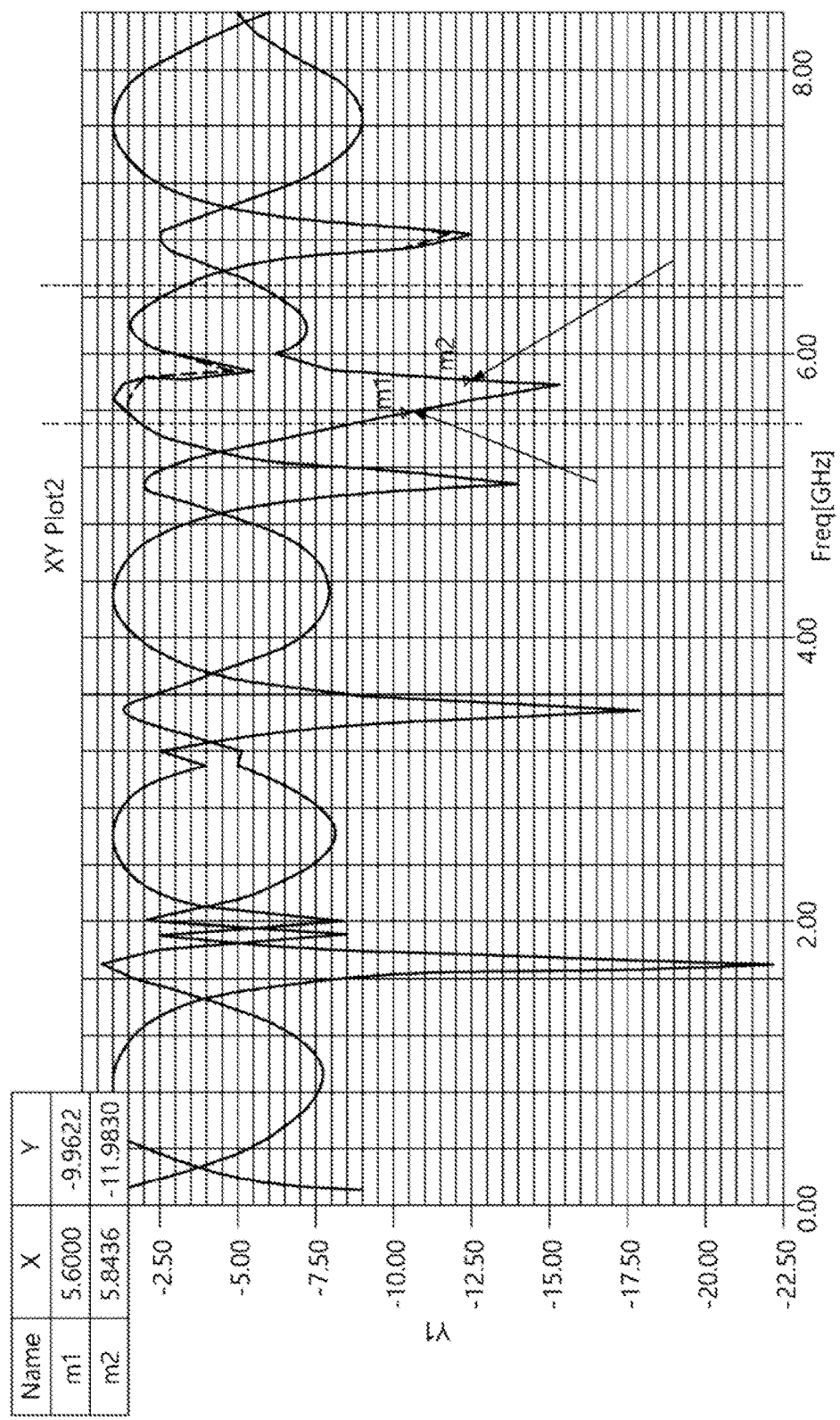
FIG. 6B is a diagram illustrating that noise generation of a common mode signal is suppressed when the electromagnetic interference suppressing structure is disposed in accordance with an embodiment.

FIG. 6A is a diagram illustrating that noise generation of a differential signal is suppressed when the electromagnetic interference suppressing structure in accordance with the embodiment is disposed. FIG. 6B is a diagram illustrating that noise generation of a common mode signal is suppressed when the electromagnetic interference suppressing structure in accordance with the embodiment is disposed. As may be readily seen from FIG. 6A, both the matching degree of a differential signal and a lost property curve (the lower curve in the drawing) satisfy a requirement of the actual application of the transmission quality of a product which is in general, equal to or smaller than approximately −10 dB. In FIG. 6A, the region between the two dotted lines represents a frequency band with a frequency of approximately 6 GHz, and noise generation conforms to a general standard. FIG. 6B is a diagram illustrating the signal strength related to a common mode signal. The drawing depicts, as an example, a suppression level in a common mode signal which controls a suppressing effect to the frequency range of approximately 6 GHz. That is, according to an embodiment FIG. 6B describes that a signal with a frequency range of approximately 6 GHz (for example, see the two arrows in FIG. 6B) is controlled to be equal to or smaller than approximately −10 dB by a structural design which is set by the length of the perimeter formed by the above-described extended region 312. The design of the frequency band may be described with an example of wireless communication in a notebook computer which uses a transmission frequency band of approximately 6 GHz. Therefore, by using the configuration according to the embodiment, the common mode noise generated from an electrical circuit for example, in a notebook computer, may be effectively suppressed so that a wireless transmission using a frequency band of approximately 6 GHz may not be interfered with.

As is apparent from the above descriptions, according to the embodiments, due to a technical feature that two grounding recess structures do not extend across a region lying under a differential pair, electromagnetic interference is not exerted on the differential pair, and accordingly, it is possible to provide an improved electromagnetic interference suppressing effect.

The electromagnetic interference suppressing structure and the electronic device having the same described herein should not be limited based on the described embodiments. Various embodiments have been disclosed above for illustrative purposes. Those of ordinary skill in the art will appreciate that various modifications, additions and substitutions are possible without departing from the scope and spirit of the present disclosure as disclosed in the accompanying claims.

What is claimed is:

1. An electromagnetic interference suppressing structure comprising:
    a multi-layered substrate;
    a differential pair including first and second signal lines which are disposed on a first layer of the multi-layered substrate; and
    two grounding recess structures disposed symmetrically in a second layer of the multi-layered substrate which is positioned under the first layer, and on both sides, respectively, of the differential pair,
    wherein no electrical coupling element extends across a region lying directly under the differential pair, between the two grounding recess structures.

2. The electromagnetic interference suppressing structure according to claim 1,
    wherein each of the two grounding recess structures comprises a strip region and an extended region which is connected to the strip region, and
    wherein the two grounding recess structures are symmetrically positioned in the second layer of the multi-layered substrate, with the differential pair positioned at a middle, and the extended region is connected to and respectively positioned outside the strip region, and wherein the second layer of the multi-layered substrate serves as a grounded conductive layer and portions recessed in the grounded conductive layer form the two grounding recess structures.

3. The electromagnetic interference suppressing structure according to claim 2, wherein the extended region has a rectangular shape, a polygonal shape, or a substantial S-shape.

4. The electromagnetic interference suppressing structure according to claim 3, wherein a length of a perimeter of the extended region corresponds to a common mode signal having a certain frequency range, which passes through the differential pair and in which electromagnetic interference is to be suppressed.

5. An electronic device including an electromagnetic interference suppressing structure, comprising:
   a multi-layered substrate;
   two chips disposed on a first layer of the multi-layered substrate;
   a differential pair including first and second signal lines which are disposed on the first layer of the multi-layered substrate, connect the two chips and are used as signal transmission channels between the two chips; and
   two grounding recess structures disposed symmetrically in a second layer of the multi-layered substrate which is positioned under the first layer, on both sides, respectively, of the differential pair,
   wherein no electrical coupling element extends across a region lying directly under the differential pair, between the two grounding recess structures.

6. The electronic device according to claim 5,
   wherein each of the two grounding recess structures comprises a strip region and an extended region which is connected to the strip region, and
   wherein the two grounding recess structures are symmetrically positioned in the second layer of the multi-layered substrate, with the differential pair positioned at a middle, and the extended region is connected to and respectively positioned outside the strip region, and
   wherein the second layer of the multi-layered substrate serves as a grounded conductive layer and portions recessed in the grounded conductive layer form the two grounding recess structures.

7. The electronic device according to claim 6, wherein the extended region has a rectangular shape, a polygonal shape, or a substantial S-shape.

8. The electronic device according to claim 7, wherein a length of a perimeter of the extended region corresponds to a common mode signal having a certain frequency range, which passes through the differential pair and in which electromagnetic interference is to be suppressed.

* * * * *